United States Patent [19]
Dydyk

[11] 4,155,051
[45] May 15, 1979

[54] HARMONICALLY TUNED HIGH POWER VOLTAGE CONTROLLED OSCILLATOR

[75] Inventor: Michael Dydyk, Scottsdale, Ariz.
[73] Assignee: Motorola, Inc., Schaumburg, Ill.
[21] Appl. No.: 887,141
[22] Filed: Mar. 16, 1978
[51] Int. Cl.² .............................................. H03B 7/14
[52] U.S. Cl. ..................................... 331/56; 331/101; 331/177 V
[58] Field of Search ................... 331/96, 56, 101, 102, 331/107 R, 107 G, 117 R, 117 D, 177 V

[56] References Cited

U.S. PATENT DOCUMENTS

| | | | |
|---|---|---|---|
| 3,435,374 | 3/1969 | Whitten | 331/107 R |
| 3,510,800 | 5/1970 | Kaneko et al. | 331/96 |
| 3,559,097 | 1/1971 | Chang et al. | 331/107 R |
| 3,982,211 | 9/1976 | Endersz | 331/96 X |
| 4,034,314 | 7/1977 | Dydyk | 331/101 |

OTHER PUBLICATIONS

Sullivan et al., "Second Harmonic Tuning Effects on IMPATT Diode Oscillator Noise Characteristics," G-MTT Symposium Digest, May 18, 1971, pp. 92-93.

Primary Examiner—Siegfried H. Grimm
Attorney, Agent, or Firm—Eugene A. Parsons

[57] ABSTRACT

In a high power oscillator for frequencies on the order of microwave and above, a method and apparatus for tuning the oscillator in response to a control voltage applied thereto by utilizing a relatively low power varactor diode in a harmonic cavity coupled to the oscillator and without loss of efficiency.

15 Claims, 5 Drawing Figures

HARMONICALLY TUNED HIGH POWER VOLTAGE CONTROLLED OSCILLATOR

BACKGROUND OF THE INVENTION

In oscillators for frequencies on the order of microwave and above, there is an ever increasing need for greater output power. Further, in may instances it is desirable to provide the capability of tuning the oscillator through a given range. In general, voltage controlled oscillators are tuned by means of semiconductor devices, such as varactor diodes and the like. However, because of the high power output requirements of oscillators it is difficult to incorporate varactor tuning because of the high power constraints on the varactor diode. Even if a varactor diode can be obtained which will withstand the power requirements of the oscillator, it wil be extremely expensive. Further, the varactor diode is generally introduced into the circuit where it controls the frequency and power of the fundamental frequency. The high breakdown voltage varactor diodes which must be utilized have a low Q which results in substantial reduction in oscillator efficiency.

In a paper entitled "Second Harmonic Tuning Effects on IMPATT Diode Oscillator Noise Characteristics", by F. J. Sullivan and W. H. From, 1971 G-MTT Symposium Digest, pp. 92-93, a method of controlling the conventionally noisy FM characteristics of an IMPATT diode oscillator by properly terminating the second harmonic frequency is described. These authors discuss the fact that second harmonic circuit tuning in an X band IMPATT diode oscillator can be accomplished. However, this tuning is accomplished by varying the position of a wave guide variable short (mechanically) in which no power problems exist. FUrther, there is no provision for problems of loading the fundamental frequency with the harmonic circuit or discontinuities produced in the circuitry.

A high power microwave oscillator of the type described above is disclosed in U.S. Pat. No. 4,034,314, entitled "Microwave Diode Coaxial Circuit Oscillator Improvement" issued July 5, 1977 and assigned to the same assignee. This patent discloses a high power microwave oscillator with no provision for tuning the oscillator but a second harmonic resonant cavity is disclosed for controlling second harmonic loading of the diode and for reducing noise in the output signal.

SUMMARY OF THE INVENTION

The present invention pertains to oscillatory apparatus for frequencies on the order of mircowave and above wherein an oscillator including an active device and a resonant circuit is tuned by means of a second resonant circuit, tuned to a resonant frequency approximately equal to a harmonic of the resonant frequency of the oscillator, and having controllable means coupled thereto for controlling the resonant frequency thereof, and a third resonant frequency tuned to the resonant frequency of the oscillator and coupled between the oscillator and the second resonant circuit to decouple the second resonant circuit from the oscillator at the operating frequency.

It is an object of the present invention to provide a new and improved relatively high power oscillator for frequencies on the order of mircowave and above utilizing harmonic tuning.

It is a further object of the present invention to provide a relatively high power oscillator in which varactor tuning is incorporated without reducing the efficiency of the oscillator.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the Figures.

DESCRIPTION OF THE PREFERRED EMBODIMENTS

Figure 1:
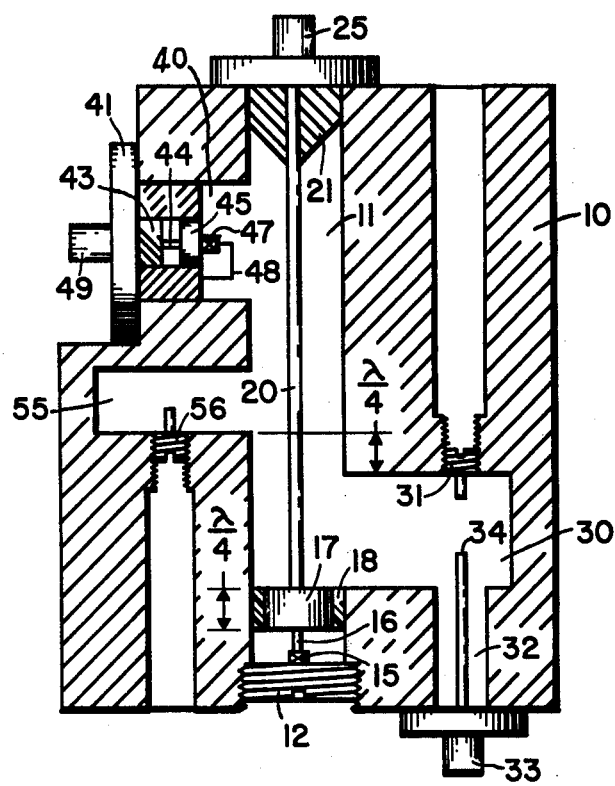
FIG. 1 is a sectional view of an oscillator for frequencies on the order of microwave and above embodying the present invention.
Figure 2:
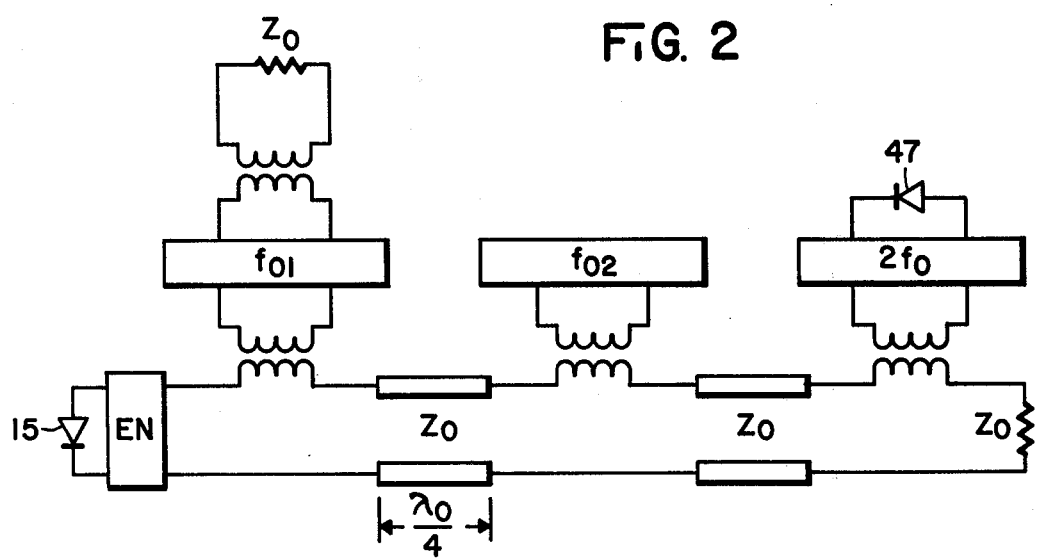
FIG. 2 is a diagrammatic representation of the circuitry of FIG. 1.

Referring specifically to FIG. 1, the numeral 10 designates a housing having an elongated generally cylindrically shaped opening 11 extending therethrough. One end of the opening 11 has a plug 12 threadedly engaged therein for longitudinal movement therealong. Throughout this discussion, it will be understood by those skilled in the art that the housing 10 may be constructed of electrically conducting material or the various parts of the apparatus disclosed may be coated with conducting material to provide the required electrical conduction. An active device 15, which generally is a semiconductor diode such as an IMPATT diode or the like, is mounted against the inner side of the plug 12 so as to be in electrical contact therewith. The opposite side of the active device 15 is connected to a short section of rod 16 which is in turn connected to a quarter wave transformer 17. The rod section 16 and transformer 17 form an equalizing network (see FIG. 2) utilized to couple the active device 15 to the remainder of the circuitry with the required impedance. The transformer 17 is mounted in the opening 11 by means of a tubularly shaped portion of dielectric material 18. An elongated rod 20 extends from the inner side of the transformer 17 to the opposite end of the opening 11 and acts as an inner conductor of a coaxial section formed by the rod 20 and the opening 11. The rod 20 has a terminating load 21 affixed to the opposite end thereof so as to provide the desired termination for the coaxial line. An external connection 25 is affixed to the outer surface of the housing 10 so as to close the opening 11 while providing an external electrical connection to the rod 21. The external connector 25 is provided so that a DC bias may be applied to the active device 15 to bias the device into a desired mode of operation. If the active device 15 is an IMPATT diode, for example, a bias will be applied to the connector 25 to bias the diode into a negative resistance mode of operation.

A first resonant circuit, which in this embodiment is a generally cylindrically shaped cavity 30, is formed in the housing 10 so that the axis thereof is parallel with and spaced from the axis of the elongated opening 11 and the opening 11 extends through the cavity 30 to provide coupling therewith. A slug tuning device 31 is threadedly engaged in the housing 10 for providing a mechanical adjustment to the resonant frequency of the cavity 30. In general, the cavity 30 is tuned to a predetermined frequency which is approximately the operating frequency of the oscillator. A small opening 32 is provided in the housing 10 in communication with the cavity 30, which opening 32 is sealed by means of an external output terminal 33 having a probe 34 electrically connected thereto for removing power from the cavity 30.

A second resonant circuit, which in this embodiment is a cavity 40, is tuned to approximately a harmonic of the predetermined frequency. In general, the harmonic will be the second harmonic because it provides the best control and the widest operating bandwidth, but other higher harmonics might be utilized if desired. In this embodiment the cavity 40 is generally cylindrically shaped (could be rectangular) with the axis thereof parallel to and spaced from the axis of the opening 11, and the opening 11 extending through the cavity 40 to provide coupling therebetween. A mounting structure, generally designated 41, is mounted external to the housing 10 and in communication with the cavity 40. The structure 41 includes a central opening having a three section RF filter mounted therein, including a first section 43 of totally absorptive material, a second section 44 of high impedance line and a third section 45 of low impedance line. One side of a varactor diode 47 is coupled to the inner end of the RF filter and the other end is connected by way of a coupling loop 48, positioned within the cavity 40, to the structure 41 and, hence, the housing 10. The opposite end of the RF filter is connected to an external connector 49 adapted to receive a control voltage and apply the control voltage across the diode 47 to alter the capacitance thereof in accordance with the control voltage. Thus, the varactor diode varies the resonant frequency of the cavity 40 by way of the control voltage applied to the external terminal 49 and the RF filter provides an RF short circuit at the diode 47 to prevent RF from being coupled to the external connector 49.

A third resonant circuit, which in this embodiment is a resonant cavity 55, is coupled to the above described circuitry between the first resonant circuit and the second resonant circuit. In this embodiment, the cavity 55 is a generally cylindrically shaped cavity having an axis parallel with and spaced from the axis of the elongated opening 11, with the opening 11 extending through the cavity 55 to provide coupling therebetween. The resonant frequency of the cavity 55 may be mechanically altered by means of a slug 56 threadedly engaged in the housing 10 in communication with the cavity 55. In general, the cavity 55 is tuned to the same predetermined frequency as the cavity 30. The lower wall of the cavity 55 is parallel with and spaced fom the upper wall of the cavity 30 approximately one quarter wave length at the predetermined frequency. Therefore, since the resonant cavity 55 appears as a high impedance at the predetermined frequency and since it is one quarter wave length from the cavity 30, the cavity 55 appears as a short circuit at the upper wall of the cavity 30 to prevent the predetermined frequency from being coupled to the cavity 40. Thus, the cavity 55 operates to decouple the cavity 40 from the cavity 30 at the predetermined frequency. Further, since the predetermined frequency and the operating frequency of the oscillator are substantially similar the cavity 40 is decoupled from the cavity 30 at the operating frequency.

In the operation of the oscillator described, a control voltage is applied to the connector 49 to vary the resonant frequency of the resonant cavity 40. The resonant frequency of the cavity 40 controls the oscillator so that oscillations occur in the cavity 30 at an operating frequency which is one-half the resonant frequency of the cavity 40, i.e., the resonant frequency of the cavity 40 is a second harmonic of the resonant frequency of the cavity 30. The cavity 55 decouples the cavity 40 from the cavity 30 at the operating frequency so that there is no loss in oscillator efficiency. Because the power is in the fundamental or operating frequency and that frequency is decoupled from the cavity 40 (and the varactor 47) it is not necessary to provide a varactor with a high breakdown voltage and, consequently, a much less expensive and higher Q device can be utilized. Further, provisions are included for rotating the structure 41 relative to the cavity 40 so that a constant tuning bandwidth can be maintained as the intrinsic oscillator frequency is changed. This is done by rotating the varactor coupling mechanism area with respect to the RF magnetic field present in the cavity 40.

Figure 3:
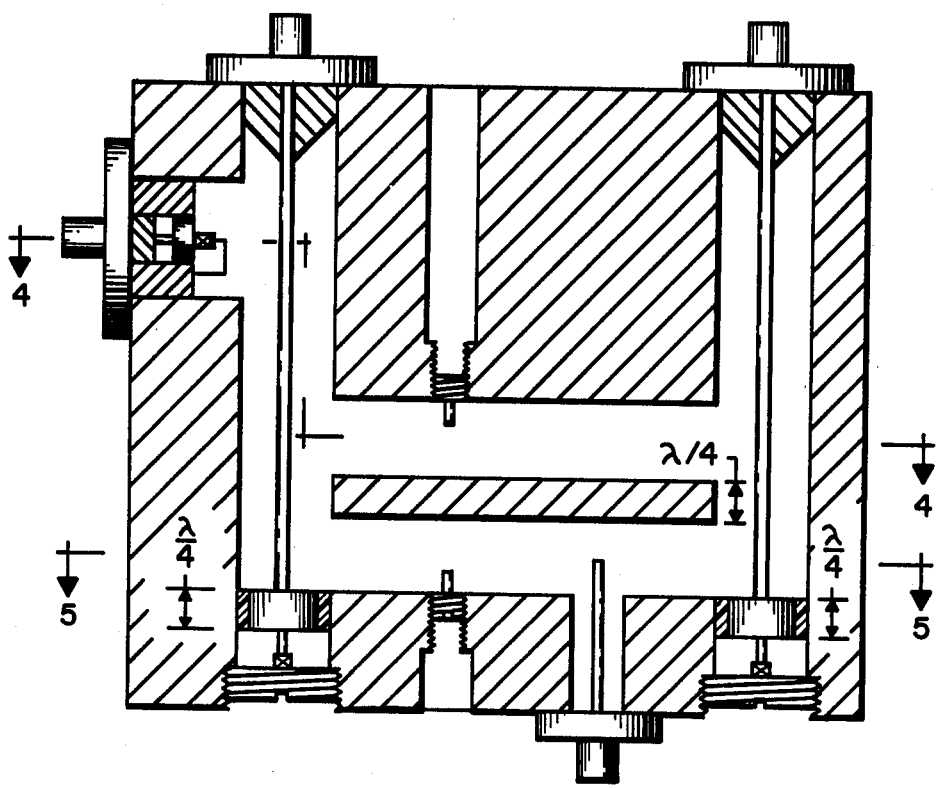
FIG. 3 is a sectional view similar to FIG. 1 of an oscillator incorporating a plurality of active devices.
Figure 4:
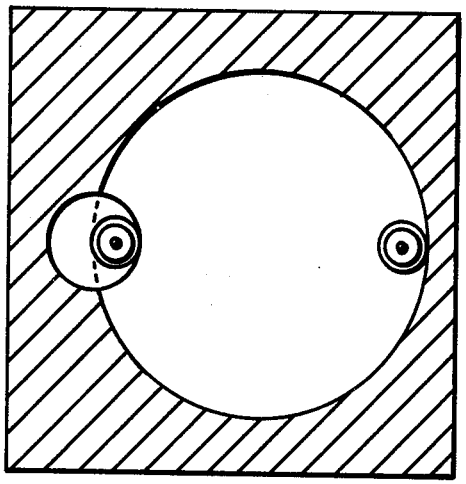
FIG. 4 is a sectional view as seen from the irregular line 4—4 in FIG. 3.
Figure 5:
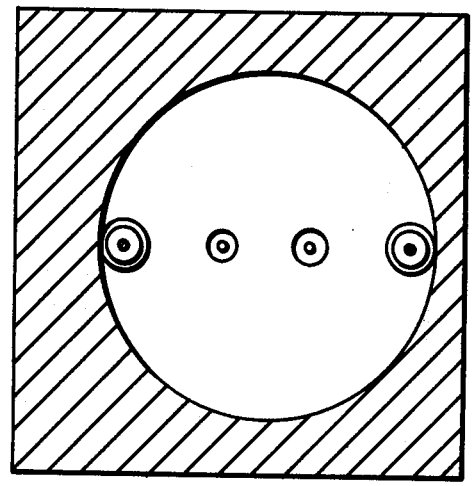
FIG. 5 is a sectional view as seen from the line 5—5 in FIG. 3.

Referring specifically to FIGS. 3, 4 and 5, a second embodiment of an oscillator incorporating the present invention is illustrated. The embodiment of FIGS. 3, 4 ad 5 is similar to the embodiment of FIG. 1 except that a plurality of active devices are coupled to the first and third resonant circuits by a plurality of coaxial sections. Only one cavity tuned to a harmonic of the operating frequency by a varactor diode is utilized since the remaining active devices will follow the varactor tuned device. The embodiment of FIGS. 3, 4 and 5 has the advantage of a higher power putput. It should be understood that additional active devices can be power combined as illustrated in the Figure for the two active devices to realize a higher power VCO if desired. The only constraint on the number of active devices utilized is the physical size of the first and third cavities.

While I have shown and described specific embodiments of this invention, further modifications and improvement will occur to those skilled in the art. I desire it to be understood, therefore, that this invention is not limited to the particular form shown and I intend in the appended claims to cover all modifications which do not depart from the spirit and scope of this invention.

What is claimed is:

1. Oscillating apparatus for frequencies on the order of microwave and above comprising primary oscillatory circuitry including an active device coupled into said circuitry for sustaining oscillations therein and a first resonant circuit tuned to a predetermined frequency, a second resonant circuit tuned to a resonant frequency approximately equal to a harmonic of the predetermined frequency and coupled to said primary oscillatory circuitry for controlling the frequency of oscillations therein, controllable means coupled to said second resonant circuit for controlling the resonant frequency thereof to control the operating frequency of said primary oscillatory circuitry, and a third resonant circuit tuned to the predetermined frequency and coupled to said primary oscillatory circuitry and said second resonant circuit so as to decouple said second resonant circuit from said first resonant circuit.

2. Oscillatory apparatus as claimed in claim 1 wherein the second resonant circuit is tuned to the second harmonic of the predetermined frequency.

3. Oscillatory apparatus as claimed n claim 1 wherein the controllable means includes a varactor diode connected to receive a control voltage thereacross.

4. Oscillatory apparatus as claimed in claim 1 wherein the active device includes a semiconductor diode biased into a negative resistance mode of operation.

5. Oscillatory apparatus as claimed in claim 4 wherein the primary oscillatory circuitry includes a section of transmission line coupling the active device and the first, second and third resonant circuits.

6. Oscillatory apparatus as claimed in claim 5 wherein the section of transmission line is a coaxial section.

7. Oscillatory apparatus as claimed in claim 6 wherein the first, second and third resonant circuits are resonant cavities.

8. Oscillatory apparatus as claimed in claim 7 wherein the first and second resonant cavities are coupled to the coaxial section in spaced apart relation with the third cavity coupled to the coaxial section therebetween.

9. Oscillatory apparatus as claimed in claim 8 wherein the third cavity presents a high impedance at the operating frequency and is coupled to the coaxial section approximately one quarter wavelength, at the predetermined frequency, from the first cavity so that the coaxial section appears as an electrical short at the predetermined frequency to the first cavity.

10. Oscillatory apparatus as claimed in claim 1 wherein the primary oscillatory circuitry includes a plurality of active devices.

11. Oscillatory apparatus for frequencies on the order of microwave and above comprising:
   (a) an active device having a negative resistance region of operation;
   (b) a first resonant cavity tuned to a predetermined frequency within the region of operation of said active device;
   (c) a second resonant cavity tuned to a resonant frequency approximately equal to a harmonic of the predetermined frequency;
   (d) controllable means coupled to said second resonant cavity for altering the resonant frequency thereof within a predetermined range in response to controlling said controllable means;
   (e) a third resonant cavity tuned to the predetermined frequency;
   (f) coupling apparatus coupling said active device and said first, second and third cavities so that said first cavity oscillates at an operating frequency controlled by the resonant frequency of said second cavity and said third cavity decouples said first cavity from said second cavity at the predetermined frequency; and
   (g) output means coupled to said first cavity for removing power therefrom at the operating frequency.

12. Oscillatory apparatus as claimed in claim 11 wherein a plurality of active devices are coupled into the oscillatory apparatus by the coupling apparatus.

13. Oscillatory apparatus for frequencies on the order of microwave and above comprising:
   (a) a semiconductor diode having a negative resistance region of operation;
   (b) a first resonant cavity tuned to a predetermined frequency within the region of operation of said semiconductor diode;
   (c) a second resonant cavity tuned to a resonant frequency approximately equal to a harmonic of the predetermined frequency;
   (d) a varactor diode coupled to said second resonant cavity for altering the resonant frequency thereof within a predetermined range in response to a control voltage applied across said varactor diode;
   (e) a third resonant cavity tuned to the predetermined frequency;
   (f) a section of coaxial line having said semiconductor diode coupled thereto adjacent one end, said first resonant cavity coupled thereto in spaced relation from said semiconductor diode, said third resonant cavity coupled thereto in spaced relation from said first resonant cavity a distance equal to N one quarter wavelengths of the predetermined frequency, where N is an odd integer, and said second resonant cavity coupled thereto in spaced relation from said third resonant cavity so that said third resonant cavity is positioned between said first and said second resonant cavities and the operating frequency of said first resonant cavity is controlled by the resonant frequency of said second resonant cavity; and
   (g) output means coupled to said first resonant cavity for removing power therefrom at the operating frequency.

14. Oscillatory apparatus as claimed in claim 13 wherein the first and third resonant cavities are generally cylindrically shaped cavities having additional sections of coaxial line and semiconductor diodes coupled thereto.

15. A method of controlling the operating frequency of a relatively high power oscillator, operating at microwave frequencies and above, with a relatively low power varactor diode comprising the steps of:
   (a) coupling a first resonant cavity tuned to a resonant frequency which is approximately a harmonic of a predetermined frequency to a cavity oscillator tuned to operate at approximately the predetermined frequency so that the operating frequency of the oscillator is controlled by the resonant frequency of the first resonant cavity;
   (b) tuning the first resonant cavity with a varactor diode; and
   (c) decoupling the first resonant cavity from the cavity oscillator with a second resonant cavity tuned to the predetermined frequency and coupled to the cavity oscillator to prevent coupling the operating frequency to the first resonant cavity.

* * * * *